United States Patent
Hanson et al.

(10) Patent No.: US 7,253,079 B2
(45) Date of Patent: Aug. 7, 2007

(54) COPLANAR MOUNTING MEMBER FOR A MEM SENSOR

(75) Inventors: David S. Hanson, Newbury, MA (US);
Richard S. Anderson, Seabrook, NH (US); Thomas F. Marinis, Haverhill, MA (US); Joseph W. Soucy, Winchester, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 59 days.

(21) Appl. No.: 10/142,127

(22) Filed: May 9, 2002

(65) Prior Publication Data

US 2003/0209789 A1 Nov. 13, 2003

(51) Int. Cl.
*H01I 29/84* (2006.01)

(52) U.S. Cl. .................. 438/417; 438/730; 438/676; 257/29.324

(58) Field of Classification Search ............... 257/417, 257/421, 428, 676, 730; 73/504.2, 514.01
See application file for complete search history.

(56) References Cited

U.S. PATENT DOCUMENTS

| | | | | |
|---|---|---|---|---|
| 5,610,431 A | * | 3/1997 | Martin | 257/415 |
| 5,806,365 A | * | 9/1998 | Zunino et al. | 73/514.16 |
| 6,035,694 A | * | 3/2000 | Dupuie et al. | 73/1.38 |
| 6,115,261 A | * | 9/2000 | Platt et al. | 361/760 |
| 6,153,839 A | * | 11/2000 | Zavracky et al. | 200/181 |
| 6,654,155 B2 | * | 11/2003 | Rosa et al. | 359/290 |
| 2002/0164114 A1 | * | 11/2002 | Golub et al. | 385/18 |
| 2003/0003705 A1 | * | 1/2003 | Chung et al. | 438/612 |

* cited by examiner

*Primary Examiner*—Thanh Nguyen
(74) *Attorney, Agent, or Firm*—Iandiorio & Teska

(57) ABSTRACT

A coplanar mounting member for a MEM sensor includes a first surface coplanar with a connection pad on the surface of a MEM sensor board containing the MEM sensor control circuit; a second surface inclined to the surface of the board for mounting a MEM sensor and an electrical conductor array for interconnecting the MEM sensor with the connection pad on the board.

9 Claims, 6 Drawing Sheets

COPLANAR MOUNTING MEMBER FOR A MEM SENSOR

RELATED APPLICATIONS

This invention was made with U.S. Government support under Contract No. F33615-98-C-108 awarded by DARPA MMIMU. The Government may have certain rights in the subject invention.

FIELD OF THE INVENTION

This invention relates to a coplanar mounting member for a MEM sensor, and more particularly such to a member for use in three axes MEMs systems such as accelerometers and gyroscopes.

BACKGROUND OF THE INVENTION

Mircro-electro-mechanical (MEM) sensors such as gyroscopes, accelerometers, vibration sensors, and microphones must be mounted in close proximity to an application specific integrated circuit (ASIC) control chip to realize optimum instrument performance. The path length of sensitive electrical nodes is typically held to 0.25 inches or less to minimize parasitic capacitance and noise susceptibility. This requirement, combined with the need to measure rotation or acceleration along three orthogonal axes in micromechanical inertial sensor assemblies (MMISA) has constrained system architectures to those typified by the competent munition advanced technology demonstration (CMATD) system shown in FIG. 1.

The MMISA in FIG. 1 occupies approximately 8 $in^3$ of the 16 $in^3$ available volume of the device. In order to reduce this volume it has been proposed to place each instrument at an angle. For example, in CMATD systems, the three gyro and three accel instruments are mounted on separate circuit boards which are in turn mounted orthogonal to each other. A circuit backplane and flexible cabeling are used to interconnect these six instruments. In order to reduce this volume it has been proposed to place the three gyro instruments onto a single circuit board and the three accel instruments onto single circuit board, which allows for a substantial reduction in redundant component. The challenge is in mounting the three gyro and three accel sensor devices orthogonal to each other on a coplanar surface while maintaining the close proximity to their associated ASICs.

SUMMARY OF THE INVENTION I

It is therefore an object of this invention to provide an improved coplanar mounting member for a MEM sensor.

It is a further object of this invention to provide such an improved coplanar mounting member which reduces the size of MEM sensor systems such as inertial guidance systems.

It is a further object of this invention to provide such an improved coplanar mounting member which reduces the redundancy in the MEM sensor control circuits.

It is a further object of this invention to provide such an improved coplanar mounting member which reduces the cost of such MEM sensor systems through reduction in number of components, enables less complex cabling, and improves reliability.

It is a further object of this invention to provide such an improved coplanar mounting member which permits the same MEM sensor to be used for in plane and out-of-plane sensing, e.g., three identical gyroscopes or three identical accelerometers.

It is a further object of this invention to provide such an improved coplanar mounting member which avoids the instability of the sense axes of non-coplanar mounted MEM sensors.

The invention results from the realization that more compact smaller, and more reliable MEM sensor systems can be made using one or more coplanar mounting members which include a first surface coplanar with a connection pad on the surface of a MEM sensor board containing the MEM sensor controls circuits, a second surface inclined to the surface of the board for mounting a MEM sensor and an electrical conductor array for interconnecting the MEM sensor with the connection pad on the board.

This invention features a coplanar mounting member for a MEM sensor including a first surface coplanar with a connection pad on the surface of the MEM sensor board containing the MEM sensor control circuit. There is a second surface inclined to the surface of the board for mounting a MEM sensor and an electrical conductor array for interconnecting the MEM sensor with the connection pad on the board.

In a preferred embodiment the second surface may be inclined at approximately 35°, 54°, or at 90° to the board. The MEM sensor may be an inertial sensor and may be a gyroscope sensor or an accelerometer sensor. The sensor board may include an ASIC; the MEM sensor may be integral with the second surface.

The invention also features a three axes MEMs accelerometer system including three MEM accelerometer sensors and a MEM sensor board including a MEM sensor control circuit for the accelerometer sensors. The accelerometer sensors are mounted mutually orthagonally. There are at least two coplanar mounting members having a first surface coplanar with a connection pad on the surface of the sensor board. The second surface is inclined to the surface of the board for mounting a MEM accelerometer sensor. An electrical conductor array interconnects the MEM accelerometer sensor with the connection pad on the board.

In a preferred embodiment there may be two coplanar mounting members and the second surface may be inclined at approximately 90°. There may be three coplanar mounting members and each may have a second surface inclined at approximately 54°.

The invention also features a three axes MEMs gyroscope system including three MEM gyroscope sensors and a MEM sensor board including a MEM sensor control circuit for the gyroscope sensors. The gyroscopes are mounted mutually orthogonally. There is at least one coplanar mounting member having a first surface coplanar with a connection pad on the surface of the sensor board and a second surface inclined to the surface of the board for mounting a MEM gyroscope sensor. There is an electrical conductor array for interconnecting the MEM gyroscope sensor with the connection pad on the board.

In a preferred embodiment there may be one coplanar mounting member and the second surface may be approximately 90°. There may be three coplanar mounting members and each second surface may be at approximately 35°.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
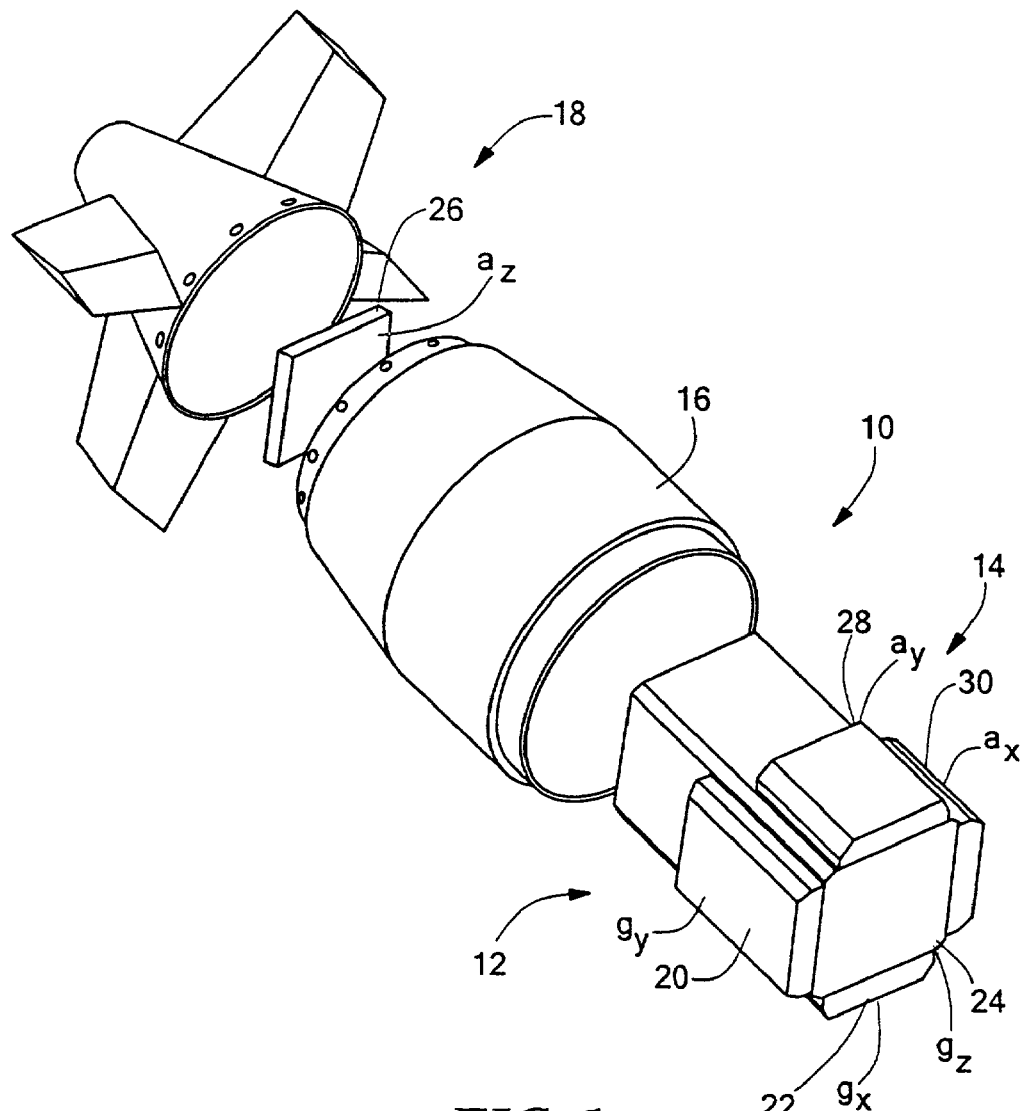
FIG. 1 is a three dimensional schematic view of a prior art inertial guidance system in a typical application in a tactical missile.

There is shown in FIG. 1 a typical prior art inertial guidance system 10 including a three axes gyroscope system 12 and a three axes accelerometer system 14 mounted in the body 16 of tactical missile 18. Three axes gyroscope system 12 includes three separate gyroscope instruments, 20, 22, and 24, which are arranged in mutually perpendicular planes. Each gyroscope instrument 20, 22 and 24 includes its own gyroscope MEM sensor which is an in-plane sensor. That is, the sensing axis of each of the MEM sensors 20, 22, 24 is within the plane of the instrument which also contains the associated control circuits. The three axes accelerometer system 14 includes three accelerometer instruments, 26, 28 and 30. Together the six instruments make up an inertial guidance system which occupies approximately 8 cubic inches of the available 16 cubic inches in the body 16. The accelerometers sense out-of-plane or normal to the plane of their instrument which also contains a control circuit. In addition these instruments typically include an application specific integrated circuit (ASIC) usually on the back side of the instrument. The instrument has a control circuit related to the sensor on one side and on the other, the associated ASIC, and the support layer between may be a printed circuit board, or laminar structure, a ceramic board, or any other kind of suitable support structure.

Figure 2:
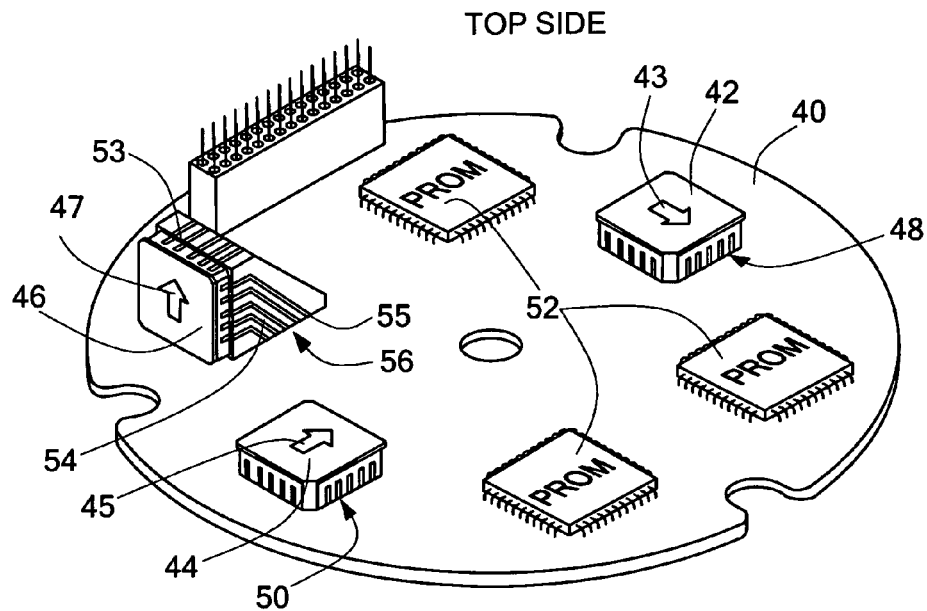
FIG. 2 is a schematic top view of a three axes gyroscope instrument using a coplanar mounting member according to this invention.
Figure 3:
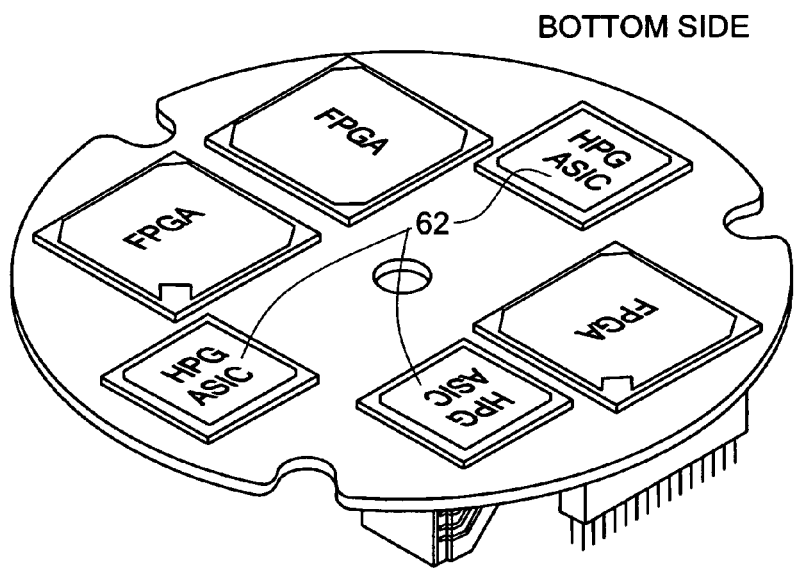
FIG. 3 is a schematic bottom view of the device in FIG. 2.

In accordance with this invention a single printed circuit board or other support structure 40, FIGS. 2 and 3, can be used to support all three MEM sensors, such as gyroscope sensors 42, 44 and 46. Gyroscope sensors 42 and 44 sense $g_x$ (arrow 43) direction and $g_y$ (arrow 45) direction, respectively, and are mounted directly on connection pads 48 and 50, which are interconnected with the rest of the control circuitry 52 on board 40. In order for the third MEM's gyroscope sensor 46 to provide the mutual perpendicularity sense $g_z$ direction (arrow 47) as required, it is mounted on a surface 53 of coplanar mounting member or wedge 54. The lower surface 55 of mounting member 54 is mounted to connection pad 56. Also visible in FIG. 3 is the ASIC circuits 62. Because of the compact construction shown in the device of FIGS. 2 and 3 a number of redundant components can be eliminated in the control circuit which is made to serve all three sensors 42, 44 and 46. The three ASICs 62, one associated with each of the MEM sensors are located on the bottom of printed circuit board or other support 40.

Figure 4:
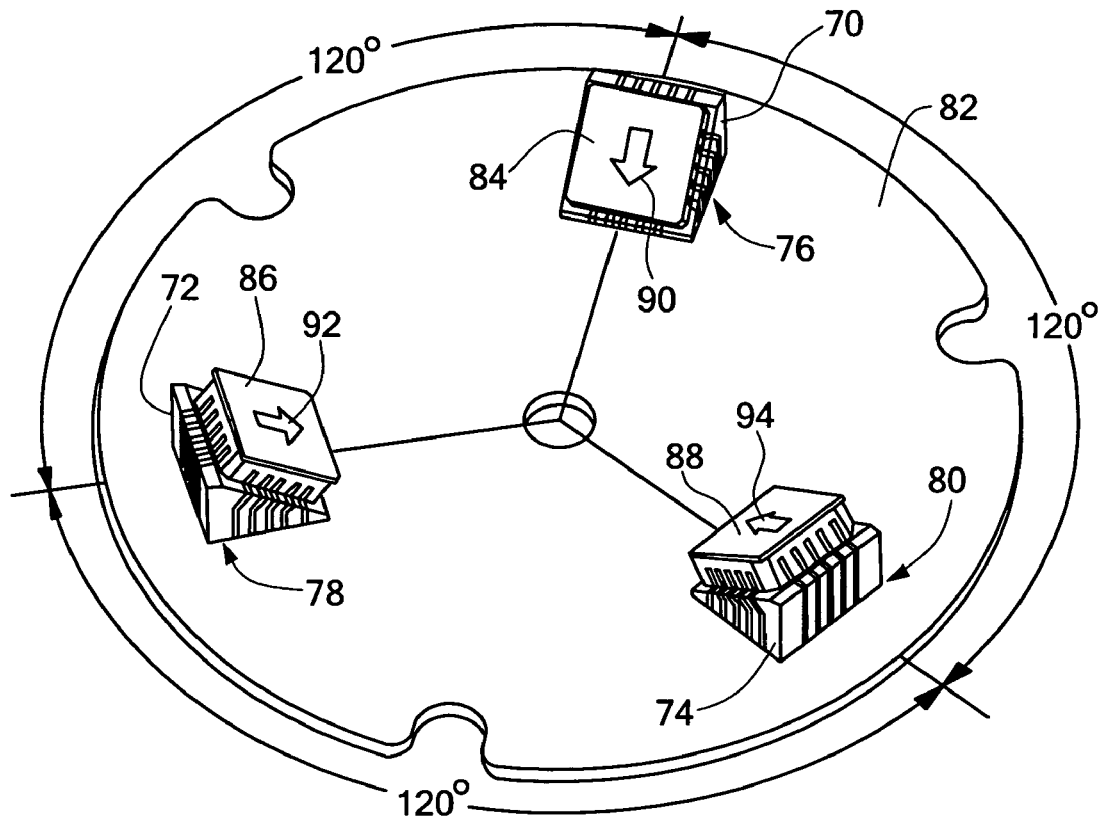
FIG. 4 is a view similar to FIG. 2 of an alternative embodiment of a gyroscope system using three coplanar mounting members according to this invention.
Figure 5:
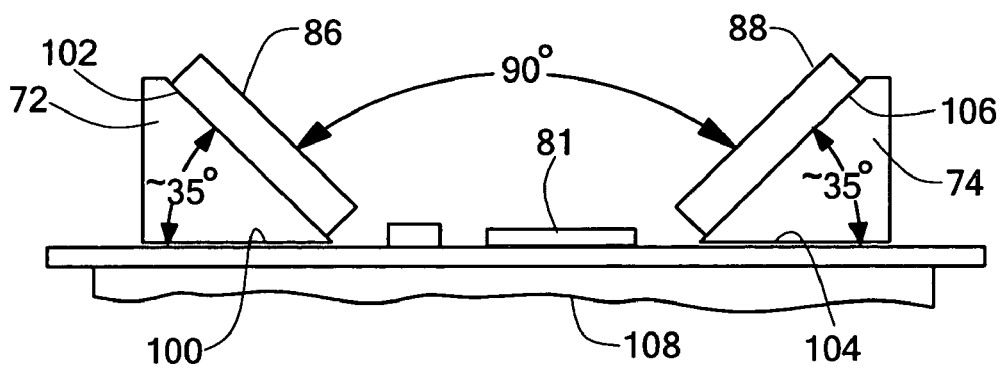
FIG. 5 is a side schematic sectional elevational view of the device of FIG. 4.

In FIGS. 2 and 3 the MEM gyroscope sensor 46 is shown mounted vertically on a coplanar mounting member 54 or perpendicular, to the plane of the board 40. This is not a necessary limitation of the invention. For example, as shown in FIGS. 4 and 5, three wedges or coplanar mounting members 70, 72 and 74 can be mounted directly to connection pads 76, 78 and 80 on board 82. Each wedge or coplanar mounting member 70, 72, 74 connects on one surface with its associated connection pad 76, 78, and 80, and on its second surface, with the gyroscope sensor 84, 86 and 88, respectively. In the plan view of FIG. 4 it can be seen that the three wedges 70, 72, and 74, and their associated MEM's gyroscope sensors 84, 86 and 88 are spaced a 120° apart. In addition, in three dimensional space they are mutually orthogonal as shown in FIG. 5. The arrows 90, 92, and 94 indicate the direction of sense of each of the MEM gyroscope sensors.

Also shown in FIG. 5 are the mounting surfaces 100 and 102 of mounting member 72 and mounting surfaces 104 and 106 of mounting member 74. Note: all the mounting members 70, 72, 74 have an angle of approximately 35° to maintain the 90° mutual perpendicularity required of the three MEM gyroscope sensors. Also shown in FIGS. 4 and 5 are the control circuit 81 and ASIC circuits 108.

Figure 6:
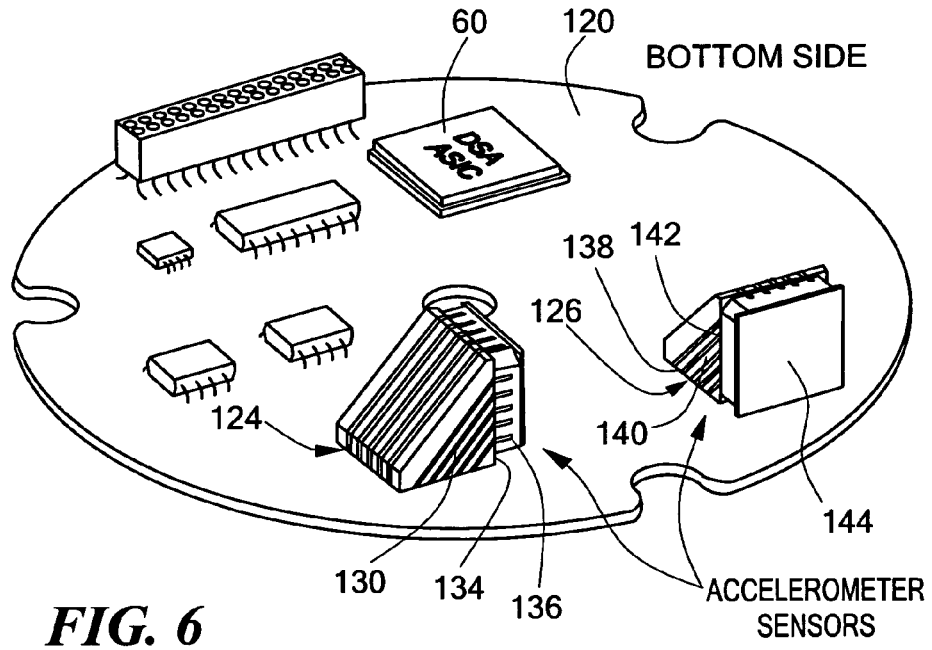
FIG. 6 is a schematic bottom view of two axes accelerometer instruments using two coplanar mounting members according to this invention.
Figure 7:
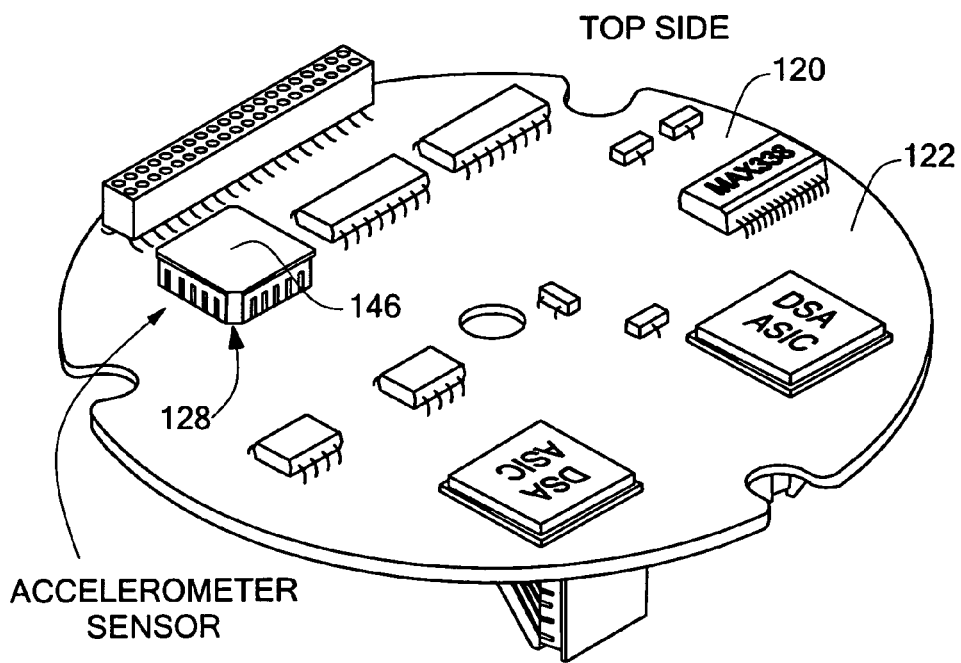
FIG. 7 is a schematic top view of the device of FIG. 6.

Although thus far the invention has been described with respect to a three-axes gyroscope system, it may also be used to create a three-axes accelerometer system as shown in FIGS. 6 and 7, where printed circuit board 120 contains typical sensor control circuit 122 and three connection pads 124, 126, and 128. Pad 124 contacts a coplanar mounting member 130 whose first surface contacts connection pad 124 and whose second surface 134 receives MEM's accelerometer sensor 136. Connection pad 126 receives the first surface 138 of coplanar mounting member 140 whose second surface 142 receives MEM accelerometer sensor 144. The third MEM sensor 146 does not require a special coplanar mounting member but mounts directly to connection pad 128. The accelerometers all have out of plane or perpendicular sensing axes $a_x$, $a_y$, $a_z$, thus MIEM accelerometer sensors 144 and 136 sense in the X and Y axis, respectively, to board 120, while the MLEM sensors 146 senses in Z axis direction with respect to board 120. Again, the associated ASICs 160 are mounted on the underside of board 120.

Figure 8:
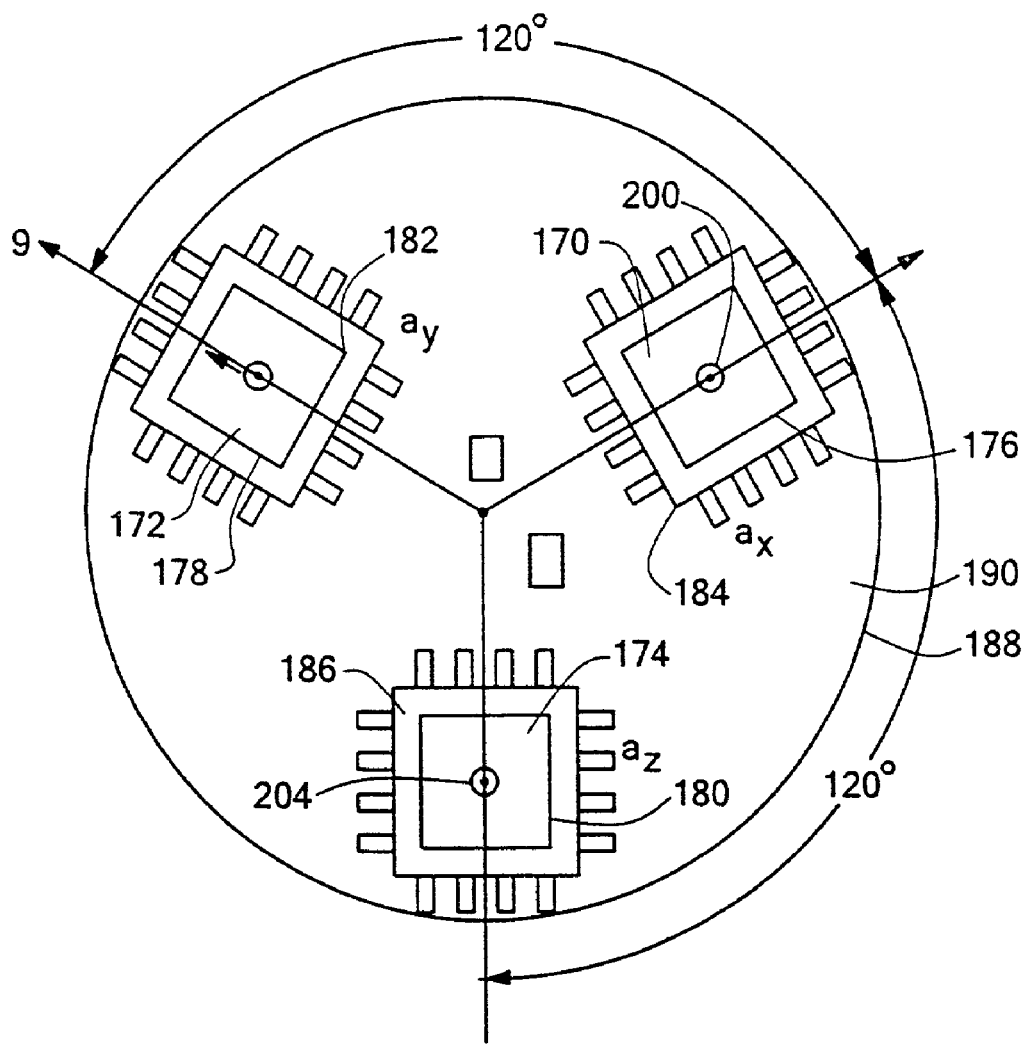
FIG. 8 is a view similar to FIG. 6 of an alternative embodiment of the three axes accelerometer system using three coplanar mounting members according to this invention.
Figure 9:
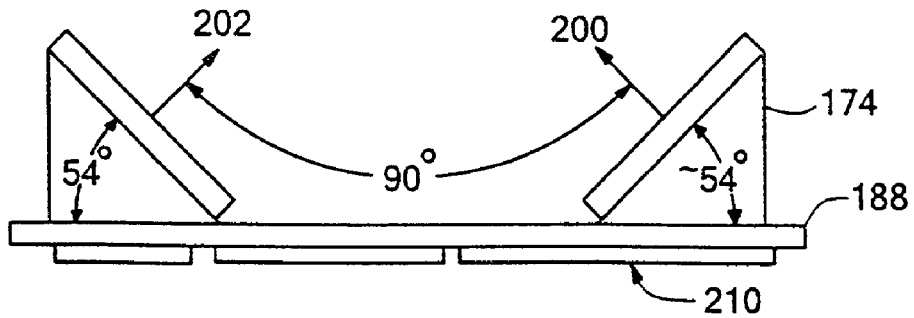
FIG. 9 is a side schematic sectional elevational view of the device of FIG. 8.

In an alternate embodiment, FIGS. 8 and 9, each of the MEM's accelerometer sensors 170, 172, and 174 is mounted on a coplanar mounting member 176, 178 and 180, which mount to connection pads 182, 184, and 186 on printed circuit board 188, which also contains the electronic circuits 190 associated with the MEM accelerometer sensors. These three MEM sensors 170, 172, and 174 are spaced a 120° apart on board 188 and as can be seen from FIG. 9, they are mutually perpendicularly mounted by virtue of their approximately 54° angle in each of the wedges.

The sense axes 200, 202, and 204 of each of the MEM accelerometer sensors 170, 172, and 174 are perpendicular to the plane of those sensors and are mutually perpendicular to each other as can be seen in FIG. 9 where the wedges have the angle of approximately 54° to board 188 in order to create the mutual perpendicularity between the three axes 200, 202, and 204. Also shown in FIG. 9 is the presence of the associated ASICs 210 on the underside of board 188.

Figure 10:
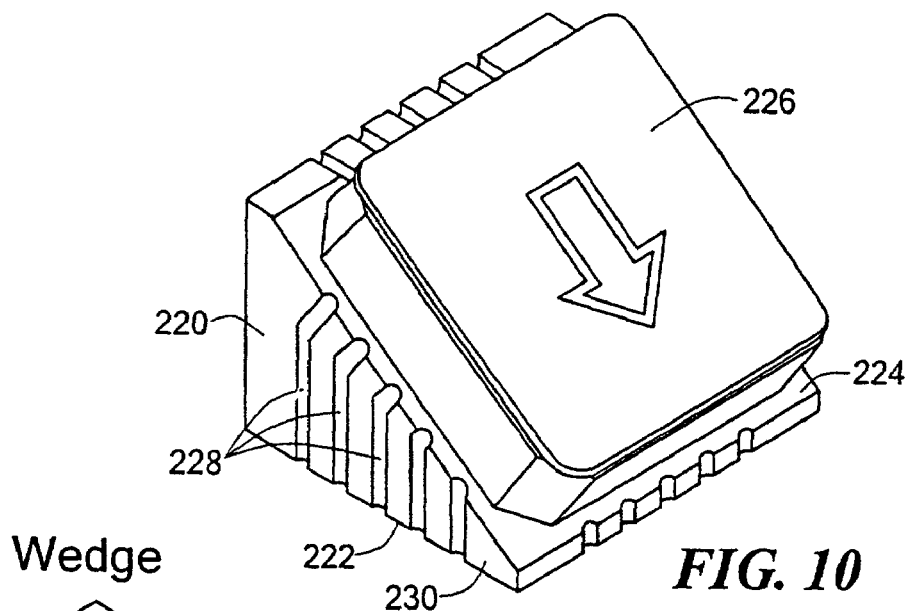
FIG. 10 is a three dimensional view of a coplanar mounting member according to this invention which may be used in the systems of FIGS. 2-9.
Figure 12:
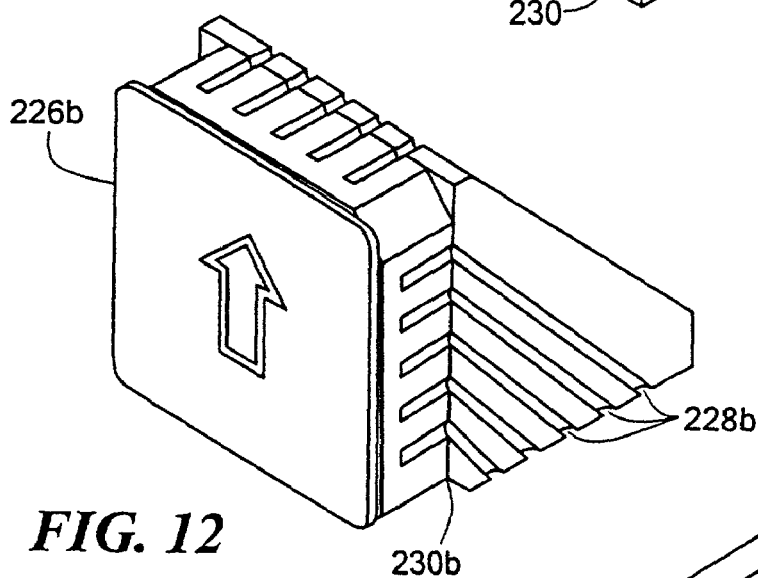
FIG. 12 is a view similar to that of FIGS. 10 and 11 of a coplanar mounting member according to this invention whose second surface for mounting a MEM sensor is at 90°.
Figure 11:
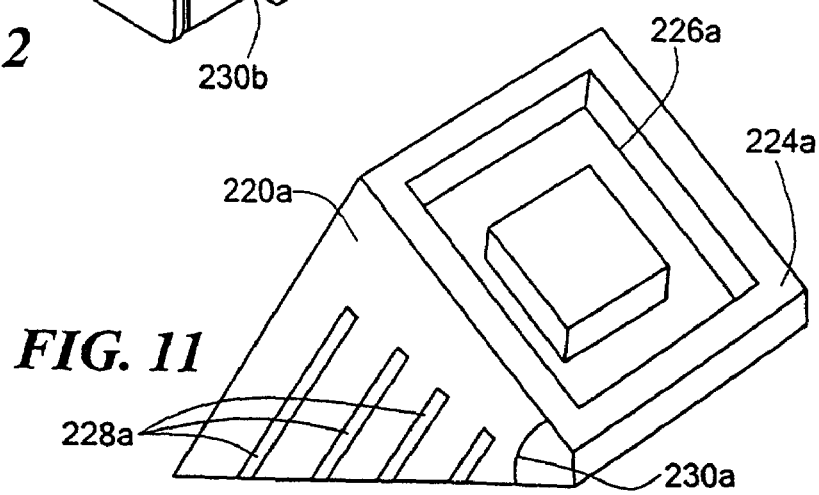
FIG. 11 is a view similar to FIG. 10 of an alternative embodiment of a coplanar mounting member according to this invention.

The coplanar mounting member of this invention may include a ceramic wedge 220, FIG. 10, which has a first surface 222, for mounting to a connection pad, and a second surface 224 for receiving a MEM sensor 226 of whatever type. An array of conductors 228 is provided to interconnect the sensor 226 with the appropriate connection pad at first surface 222. The angle of the wedge as shown at 230 may be approximately 35° for a gyroscope sensor, or approximately 54° for an accelerometer sensor. More accurately, those angles are 35.688° and 54.312°, respectively. Although in FIG. 10 the wedge 220 and MEM sensor 226 are shown as discrete parts, this is not a necessary limitation of the invention, for, as shown in FIG. 11, the MEM sensor 226*a* may be formed integrally as a part of surface 224*a* of wedge 220*a*. The second surface for mounting the MEM sensor is not limited to approximately 35° or approximately 54° or any other specific angle. For example, it can be any angle, including 90°, as shown at angle 230*b*, FIG. 12, such as where it is used in the embodiments of FIGS. 2 and 3, or FIGS. 6 and 7, or as shown in FIG. 12, where the sensor 226*b* and wedge 220*b* are once again shown as discrete parts.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A coplanar mounting member for a MEM sensor, comprising: a first surface coplanar with a connection pad on the surface of a MEM sensor board containing the MEM sensor control circuit; a second surface inclined at approximately 90° to said surface of said board for mounting a MEM sensor; and an electrical conductor array for interconnecting the MEM sensor with the connection pad on the board.

2. The coplanar mounting member of claim 1 in which said MEM sensor is an inertial sensor.

3. The coplanar mounting member of claim 2 in which said MEM sensor is a gyroscope sensor.

4. The coplanar mounting member of claim 2 in which said MEM sensor is an accelerometer.

5. The coplanar mounting member of claim 1 in which said sensor board includes an ASIC.

6. The coplanar mounting member of claim 1 in which the MEM sensor is integral with said second surface.

7. A MEM sensor system comprising:
a sensor circuit board including at least one connection pad;
a mounting member including a first surface on and co-planar with the connection pad, and a second surface inclined at approximately 90° with respect to the first surface; and
a MEM sensor mounted to the second surface of the mounting member,
the mounting member including electrical conductors interconnecting the MEM sensor with the connection pad.

8. A coplanar mounting member for a MEM sensor, comprising: a first surface coplanar with a connection pad on the surface of a MEM sensor board containing the MEM sensor control circuit; a second surface inclined at 90° to said surface of said board for mounting a MEM sensor; and an electrical conductor array for interconnecting the MEM sensor with the connection pad on the board.

9. A MEM sensor system comprising:
a sensor circuit board including at least one connection pad;
a mounting member including a first surface on and co-planar with the connection pad, and a second surface inclined at 90° with respect to the first surface; and
a MEM sensor mounted to the second surface of the mounting member,
the mounting member including electrical conductors interconnecting the MEM sensor with the connection pad.

* * * * *